United States Patent
Moffat et al.

(10) Patent No.: US 11,164,801 B2
(45) Date of Patent: Nov. 2, 2021

(54) ELECTRICALLY TESTABLE INTEGRATED CIRCUIT PACKAGING

(71) Applicant: pSemi Corporation, San Diego, CA (US)

(72) Inventors: Mark Moffat, Mortimer (GB); Andrew Christie, Reading (GB); Duncan Pilgrim, Encinitas, CA (US); Ronald Eugene Reedy, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 57 days.

(21) Appl. No.: 16/884,834

(22) Filed: May 27, 2020

(65) Prior Publication Data

US 2020/0365470 A1    Nov. 19, 2020

Related U.S. Application Data

(60) Continuation of application No. 16/140,381, filed on Sep. 24, 2018, now Pat. No. 10,699,970, which is a
(Continued)

(51) Int. Cl.
*H01L 21/66* (2006.01)
*H01L 23/055* (2006.01)
(Continued)

(52) U.S. Cl.
CPC ............ *H01L 22/14* (2013.01); *H01L 23/055* (2013.01); *H01L 22/32* (2013.01); *H01L 23/15* (2013.01);
(Continued)

(58) Field of Classification Search
CPC ................................................ H01L 23/49827
See application file for complete search history.

(56) References Cited

U.S. PATENT DOCUMENTS 9,837,325 B2    12/2017   Moffat et al.
10,109,537 B2   10/2018   Moffat et al.
(Continued)

OTHER PUBLICATIONS

Nguyen, Cuong Quang, Office Action received from the USPTO dated Jul. 30, 2019 for U.S. Appl. No. 15/799,870, 5 pgs.
(Continued)

*Primary Examiner* — William A Harriston
(74) *Attorney, Agent, or Firm* — Jaquez Land Greenhaus & McFarland LLP; John Land, Esq.

(57) ABSTRACT

An extension of conventional IC fabrication processes to include some of the concepts of flip-chip assemblies while producing a final "non-flip chip" circuit structure suitable for conventional packaging or for direct usage by customers. Multiple IC dies are fabricated on a semiconductor wafer in a conventional fashion, solder bumped or the like, and singulated. The singulated dies, which may be of different sizes and functionality, are then flip-chip assembled onto a single tile substrate of thin-film material which has been patterned with vias, peripheral connection pads, and one or more ground planes. Once dies are flip-chip mounted to the thin-film tile, all of the dies on the entire tile may be probed using automated testing equipment. Sets of dies of different functionality may be tested as a system or subsystem. Once test probing is complete, the dies (or sets of dies) and tile are singulated into die/tile assemblies.

40 Claims, 8 Drawing Sheets

Related U.S. Application Data continuation-in-part of application No. 15/799,870, filed on Oct. 31, 2017, now Pat. No. 10,109,537, which is a division of application No. 14/741,303, filed on Jun. 16, 2015, now Pat. No. 9,837,325.

(51) Int. Cl.

| | | |
|---|---|---|
| *H01L 23/66* | (2006.01) | |
| *H01L 23/31* | (2006.01) | |
| *H01L 23/498* | (2006.01) | |
| *H01L 23/15* | (2006.01) | |
| *H01L 25/065* | (2006.01) | |
| *H01L 25/18* | (2006.01) | |
| *H01L 23/00* | (2006.01) | |

(52) U.S. Cl.
CPC .... *H01L 23/3121* (2013.01); *H01L 23/49827* (2013.01); *H01L 23/49838* (2013.01); *H01L 23/66* (2013.01); *H01L 24/13* (2013.01); *H01L 24/16* (2013.01); *H01L 24/32* (2013.01); *H01L 24/48* (2013.01); *H01L 24/97* (2013.01); *H01L 25/0655* (2013.01); *H01L 25/18* (2013.01); *H01L 2223/6627* (2013.01); *H01L 2223/6677* (2013.01); *H01L 2223/6683* (2013.01); *H01L 2224/11* (2013.01); *H01L 2224/131* (2013.01); *H01L 2224/13147* (2013.01); *H01L 2224/16227* (2013.01); *H01L 2224/16235* (2013.01); *H01L 2224/32225* (2013.01); *H01L 2224/45099* (2013.01); *H01L 2224/48227* (2013.01); *H01L 2224/73265* (2013.01); *H01L 2224/81* (2013.01); *H01L 2224/83851* (2013.01); *H01L 2224/85* (2013.01); *H01L 2224/94* (2013.01); *H01L 2224/97* (2013.01); *H01L 2924/00014* (2013.01); *H01L 2924/014* (2013.01); *H01L 2924/10253* (2013.01); *H01L 2924/14* (2013.01); *H01L 2924/1421* (2013.01); *H01L 2924/15159* (2013.01); *H01L 2924/15162* (2013.01); *H01L 2924/15192* (2013.01); *H01L 2924/15313* (2013.01); *H01L 2924/15787* (2013.01); *H01L 2924/16251* (2013.01); *H01L 2924/19041* (2013.01); *H01L 2924/19042* (2013.01); *H01L 2924/19043* (2013.01); *H01L 2924/19105* (2013.01); *H01L 2924/3011* (2013.01)

(56) References Cited

U.S. PATENT DOCUMENTS

| | | | |
|---|---|---|---|
| 10,699,970 B2* | 6/2020 | Moffat | H01L 22/14 |
| 2002/0109223 A1 | 8/2002 | Katoh | |
| 2005/0285234 A1 | 12/2005 | Kanno | |
| 2009/0153158 A1 | 6/2009 | Dunn et al. | |
| 2010/0102436 A1 | 4/2010 | Eng et al. | |
| 2010/0164079 A1 | 7/2010 | Dekker et al. | |
| 2011/0208467 A1 | 8/2011 | Tang | |
| 2014/0264337 A1* | 9/2014 | Chen | H01L 23/5386 257/48 |
| 2016/0041046 A1 | 2/2016 | Pagani | |
| 2016/0372387 A1* | 12/2016 | Moffat | H01L 22/14 |
| 2018/0211890 A1* | 7/2018 | Moffat | H01L 24/97 |
| 2019/0096772 A1 | 3/2019 | Moffat et al. | |

OTHER PUBLICATIONS

Nguyen, Cuong Quang, Notice of Allowance received from the USPTO dated Sep. 10, 2019 for U.S. Appl. No. 15/799,870, 13 pgs.
PSemi Corporation, Response filed in the USPTO dated Aug. 13, 2018 for U.S. Appl. No. 15/799,870, 9 pgs.
Nguyen, Cuong Quang, Office Action received from the USPTO dated Sep. 25, 2019 for U.S. Appl. No. 16/140,381, 15 pgs.
Nguyen, Cuong Quang, Notice of Allowance received from the USPTO dated Feb. 21, 2020 for U.S. Appl. No. 16/140,381, 5 pgs.
Tran, Trang Q., Office Action received from the USPTO dated Jun. 17, 2016 for U.S. Appl. No. 14/741,303, 8 pgs.
Nguyen., Cuong Quang, Office Action received from the USPTO dated Nov. 3, 2016 for U.S. Appl. No. 14/741,303, 16 pgs.
Nguyen., Cuong Quang, Final Office Action received from the USPTO dated May 5, 2017 for U.S. Appl. No. 14/741,303, 16 pgs.
Nguyen., Cuong Quang, Advisory Action received from the USPTO dated Aug. 11, 2017 for U.S. Appl. No. 14/741,303, 4 pgs.
Nguyen., Cuong Quang, Notice of Allowance received from the USPTO dated Sep. 26, 2017 for U.S. Appl. No. 14/741,303, 5 pgs.
Moffat, et al., Response filed in the USPTO dated Jul. 1, 2016 for U.S. Appl. No. 14/741,303, 9 pgs.
Moffat, et al., Response filed in the USPTO dated Dec. 1, 17 for U.S. Appl. No. 14/741,303, 11 pgs.
Moffat, et al., Response filed in the USPTO dated Jul. 25, 17 for U.S. Appl. No. 14/741,303, 11 pgs.
PSemi Corporation, Response filed in the USPTO dated Jan. 27, 2020 for U.S. Appl. No. 16/140,381, 11 pgs.
PSemi Corporation, Preliminary Amendment filed in the USPTO dated Dec. 14, 2018 for U.S. Appl. No. 16/140,381, 6 pgs.

\* cited by examiner

Die Customers

FIG. 5A

Plastic Package

FIG. 5B

Hermetic Package

ELECTRICALLY TESTABLE INTEGRATED CIRCUIT PACKAGING

CROSS-REFERENCE TO RELATED APPLICATIONS

The present continuation application claims priority to the following patent applications, all assigned to the assignee of the present invention, the contents of all of which are incorporated by reference:

U.S. patent application Ser. No. 16/140,381, filed Sep. 24, 2018, entitled "Electrically Testable Integrated Circuit Packaging", which is a continuation-in-part of:

U.S. patent application Ser. No. 15/799,870, filed Oct. 31, 2017, entitled "Electrically Testable Microwave Integrated Circuit Packaging", (now U.S. Pat. No. 10,109,537, issued Oct. 23, 2018), which is a divisional of:

U.S. patent application Ser. No. 14/741,303, filed Jun. 16, 2015, entitled "Electrically Testable Microwave Integrated Circuit Packaging" (now U.S. Pat. No. 9,837,325, issued Dec. 5, 2017).

BACKGROUND

(1) Technical Field

This invention involves integrated circuit packaging structures and methods for integrated circuits, and related integrated circuit testing methods.

(2) Background

In typical semiconductor fabrication systems, integrated circuits (IC) dies (also known as "chips") are built up in large numbers on a single large wafer of semiconductor material, and then eventually cut out of the wafer ("singulated") as individual dies. Such ICs are generally either sold in bare die form or in packaged form (e.g., plastic packages). However, handling a conventional IC part in bare-die form is difficult for a typical customer, because clean room facilities are required to assemble the dies into a chip-and-wire hybrid assembly and specialist pick-and-place machines are required for "bumped" die. Accordingly, many customers would prefer receiving packaged ICs from vendors. In the microwave field, with frequencies between about 300 MHz and about 300 GHz, one drawback of using packaged ICs is that the package degrades the microwave performance of the part due to unwanted (parasitic) electrical effects such as bond-wire inductance.

An important aspect of packaging and testing conventional microwave ICs is limiting the effects of external influences and uncompensated parasitic influences (e.g., parasitic inductances and capacitances) on the designed microwave circuitry embodied on an IC die. One way to do so is to provide ample ground connections to sensitive circuit elements and limit the electrical length of such connections.

Most microwave ICs on the market today are fabricated on substrates made from rather exotic compounds from the III-V group of semiconductors (e.g., gallium arsenide), which allow the fabrication of through-hole vias (i.e., holes piercing select areas of an IC die) to achieve low inductance ground connections on one surface of a die to selected locations on the other surface of the die. Such vias connect directly to the back surface of a III-V material IC die, and the back surface is electrically connectable directly to a circuit ground plane. The presence of through-hole vias and backside grounding allows a conventional microwave IC die to be tested using automated wafer-probe technology. After testing, validated dies are generally packaged for use by customers, with the attendant drawbacks noted above.

Disadvantages in using III-V materials for IC dies include toxicity of the materials and greater cost relative to IC dies made on silicon or on silicon-on-insulator (SOI) substrates (including but not limited to silicon-on-sapphire, or "SOS", substrates). However, typical silicon or SOI IC dies do not have the capability to form through-hole vias. Such ICs therefore rely on wire-bonds at the outer edge of a die or "flip-chip" packaging to provide grounding.

With wire bonding, a die is mounted upright in a carrier package or on a circuit board or another chip or wafer, and wires are used to electrically and mechanically couple connection pads on the edges of a die to external connector pins or circuitry. Wire-bonding is deficient at high radio frequencies (e.g., greater than about 8 GHz) because the wire-bonds have significant length and therefore inductance, which limits grounding effectiveness. Further, ground connections are limited to edges of a die; accordingly, circuit elements located away from the die edges may not be adequately grounded and/or parasitic circuit influences may be created by running conductive traces from the IC pads to the interior of the die. Such grounding problems with wire-bonded silicon or SOI dies means that automated wafer probing cannot be easily implemented, resulting in problems of verifying performance at microwave frequencies. Further, in packaged form, the parasitics of the package cause degradation of microwave performance, through bond-wire inductance in both signal and ground connections, and imperfect signal routing from a bond-wire to the exterior of the package. Moreover, testing of a packaged device generally requires a socket or fixture that leads to uncertainty and unreliability of the test results, since the test socket or fixture is not part of the final product shipped to a customer and generally adds parasitic factors to the circuit under test.

Figure 1A:
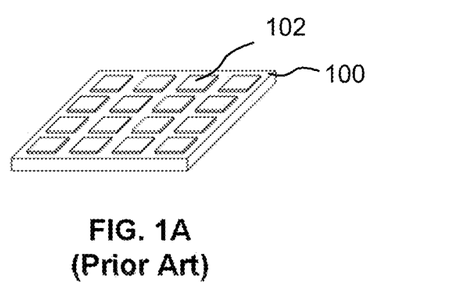
FIG. 1A shows a single integrated circuit die having a grid of metalized connection pads on the top surface.
Figure 1B:
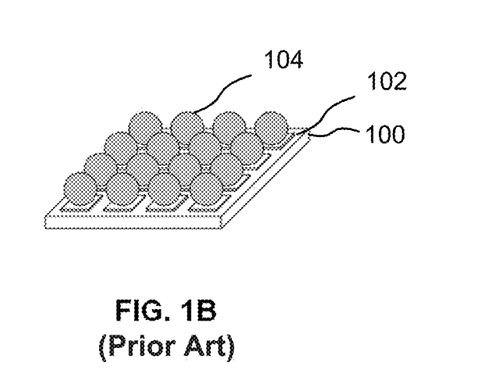
FIG. 1B shows the IC die of FIG. 1A with solder bumps deposited onto the grid of connection pads.
Figure 1C:
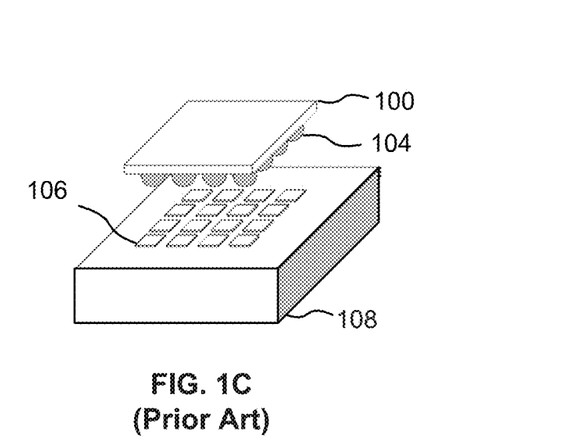
FIG. 1C shows the IC die of FIG. 1B flipped and positioned so that the solder bumps are facing a matching set of connectors of an external circuit structure.
Figure 1D:
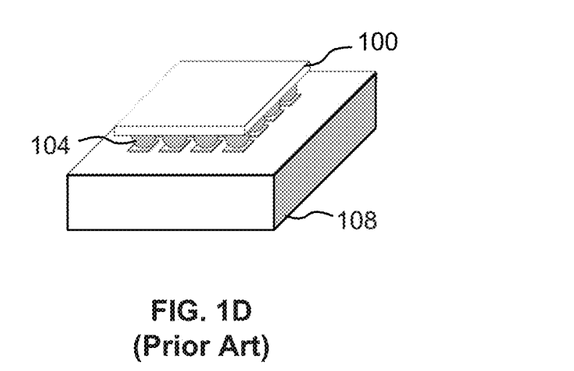
FIG. 1D shows that the solder bumps of the IC die of FIG. 1C are then re-melted to complete the interconnection.

To overcome the grounding and testing issues with wire bonding, "flip-chip" packaging and processing may be used for some applications. "Flip chip" processing (also known as controlled collapse chip connection or its acronym, C4) is a method for interconnecting IC dies to external circuitry. FIG. 1A shows a single integrated circuit die 100 having a grid of metalized connection pads 102 on the top surface; multiple dies would be simultaneously formed on a silicon or SOI wafer. FIG. 1B shows the IC die 100 of FIG. 1A with solder bumps 104 deposited onto the grid of connection pads 102. The solder bumps are usually deposited on the pads on the top side of each die of a wafer during the final wafer processing step. In order to mount a die to an external circuit structure (e.g., a circuit board or another chip or wafer), the wafer is singulated into dies, then each die is flipped over so that its top side faces down and aligned so that its pads align with matching pads on the external circuit structure. FIG. 1C shows the IC die 100 of FIG. 1B flipped and positioned so that the solder bumps 104 are facing a matching set of connectors 106 of an external circuit structure 108. FIG. 1D shows that the solder bumps 104 of the IC die 100 of FIG. 1C are then re-melted (typically using hot air reflow) to complete the interconnection. The mounted die may then be under-filled using an electrically-insulating adhesive to provide a stronger mechanical connection, provide a heat bridge, and to ensure the solder joints are not stressed due to differential heating of the chip and the rest of the system.

The resulting completed flip chip assembly is much smaller than a traditional carrier-based system; the chip can sit directly on a circuit board, and is much smaller than a carrier package in both area and height. The many short solder bump connections greatly reduce inductance, allowing higher-speed signals, and also conduct heat better. Further, automated wafer-probe technology can be used to test a flip chip while the connection pads are exposed.

However, flip chip processing has several disadvantages. Customer manufacturing processes may not be compatible with flip chip assembly, which requires special handling equipment to pick and position the singulated dies, as well as to perform the reflow process. Accordingly, flip chip microwave ICs fabricated on silicon or SOI wafers are not suitable for many customers.

The limitations of both wire-bonded packaging and flip chip assemblies are a primary hindrance to the use of silicon-based IC technology at microwave frequencies. The present invention addresses this problem.

SUMMARY OF THE INVENTION

The present invention extends conventional IC fabrication processes to include some of the concepts of flip-chip assemblies while producing a final "non-flip chip" circuit structure suitable for conventional packaging or for direct usage by customers.

In one embodiment, multiple IC dies are fabricated on a semiconductor wafer (e.g., silicon or SOI) in a conventional fashion. The dies on the wafer are then provisioned with electrically conductive structures such as solder bumps or copper pillars using commercially available processes, and singulated. Solder bumping or the like allows ground connections to be placed anywhere on the surface of a die and can therefore be close to the circuits that require them, similar to the availability of through-hole vias in III-V semiconductor-based ICs.

In an important step, the singulated dies are then flip-chip assembled onto a single tile substrate of thin-film material, such as alumina or low temperature co-fired ceramic (LTCC), etc., which has been patterned with vias, peripheral connection pads, and one or more ground planes.

Once dies are flip-chip mounted to the thin-film tile, all of the dies on the entire tile may be tested using automated testing equipment by directly probing the tile and connecting to the die via the tile interconnects. Once test probing is complete, the dies and tile are singulated into die/tile assemblies. There are a number of options available for the final package application of the die/tile assemblies.

In some embodiments, multiple dies of different size and functionality are flip-chip assembled onto a thin-film tile, subsets of which may then be tested as a system or subsystem before being singulated into die/tile assemblies.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The present invention extends conventional IC fabrication processes to include some of the concepts of flip-chip assemblies while producing a final "non-flip chip" circuit structure suitable for conventional packaging or for direct usage by customers.

In one embodiment, multiple IC dies are fabricated on a semiconductor wafer (e.g., silicon or SOI, including but not limited to silicon-on-sapphire) in a conventional fashion. The dies on the wafer are then provisioned with electrically conductive structures such as solder bumps or copper pillars using commercially available processes, and singulated. Solder bumping or the like allows ground connections to be placed anywhere on the surface of a die and can therefore be close to the circuits that require them, similar to the availability of through-hole vias in III-V semiconductor-based ICs.

In an important step, the singulated dies are then flip-chip assembled onto a single tile substrate of thin-film material, such as alumina or low temperature co-fired ceramic (LTCC), etc., which has been patterned with vias, peripheral connection pads, and one or more ground planes. In some embodiments, multiple dies of different size and functionality are flip-chip assembled onto a thin-film tile, subsets of which may then be tested as a system or subsystem.

Figure 2A:
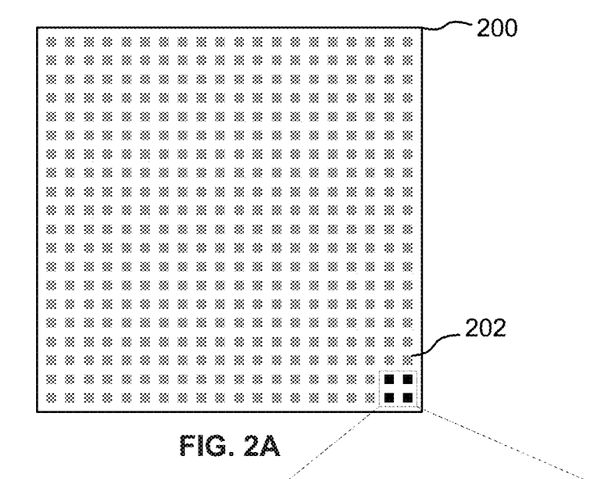
FIG. 2A is a diagram of a thin-film tile on which multiple singulated dies have been flip-chip assembled.
Figure 2B:
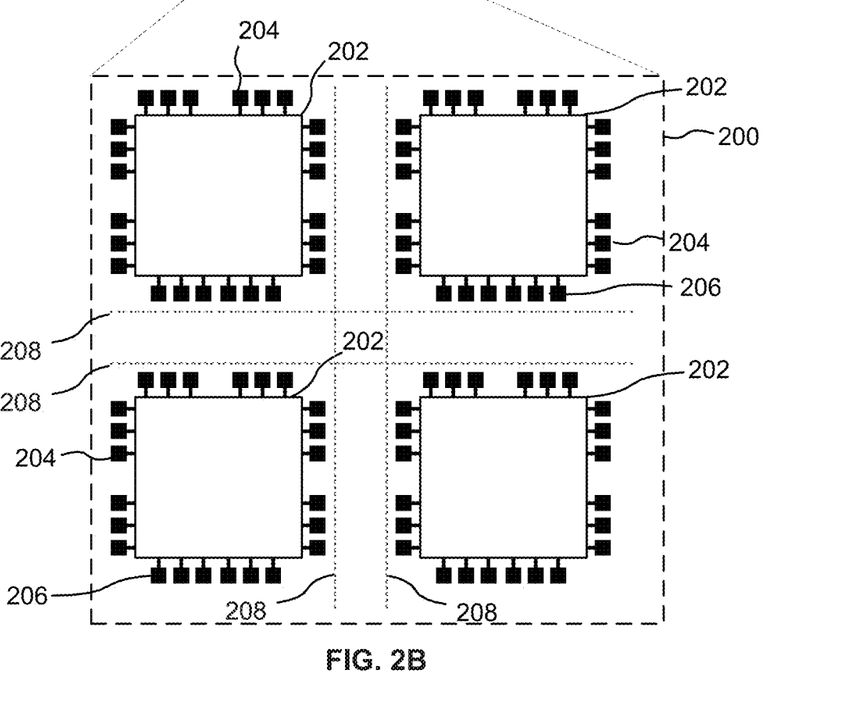
FIG. 2B is an enlarged diagram of a section of FIG. 2A, showing several singulated dies that have been flip-chip assembled.

FIG. 2A is a diagram of a thin-film tile 200 on which multiple singulated dies 202 have been flip-chip assembled (400 dies are shown in the illustrated embodiment). FIG. 2B is an enlarged diagram of a section of FIG. 2A, showing several singulated dies 202 that have been flip-chip assembled (the tile 200 has not yet been singulated). In the illustrated embodiment, the tile 200 is about 4 inches on a side, and each die is about 2×2 mm (of course, other tile and die sizes may be used).

An important characteristic of the tile 200 material is that it be as thin as possible while retaining sufficient rigidity for structural integrity and manual and automated handling. Since through-hole vias pass from the top side of the tile to the bottom side, a thin tile 200 allows a short, low-inductance ground connection from the ground electrically conductive structures (e.g., solder bumps) of the die to a circuit ground plane on the back of the tile 200. The low inductance ground connection results in low impedance at RF frequencies. Particularly good results have been found with thin-film tiles having an approximate thickness of ≤0.35 mm, ≤0.23 mm, and ≤0.175 mm (in contrast, a conventional printed circuit board typically has a thickness of 1.0-1.5 mm). The tiles 200 may be a single layer or may be a multi-layer structure. In the case of a multi-layer structure, embodiments may use blind vias (from an outer surface to a buried conductive layer) and/or buried vias (from one buried conductive layer to another buried conductive layer). Suitable tile substrates are available from Murata Manufacturing Co., Ltd and other manufacturers.

Referring again to FIG. 2B, visible are probe-compatible connection pads 204, 206 arrayed around the periphery of each die 202. These probe-compatible connection pads 204, 206 are used to automatically wafer-probe the tile 200 of dies 202 on a conventional automatic wafer-probing system. In the embodiment shown in FIG. 2B, two sets of three ground-signal-ground (GSG) probe-compatible connection pads 204 are arranged on each of the north (top of figure page), east, and west sides of the die 200. The south side of the die 20 includes six DC/control signal probe-compatible connection pads 206. In the illustrated embodiment, the GSG pads 204 are on a standard 150 μm pitch for compatibility with conventional wafer-scale probes and testing equipment. More or fewer sets of GSG pads 204 and/or DC/control signal pads 206 may be used depending on the nature of the circuitry on the die 202, and the spacing and function of the pads 204, 206 may be varied by application. The dotted lines 208 visible in FIG. 2B are the eventual singulation lines used to divide the tile 200 into individual components. Singulation does not occur until after probing to allow automatic stepping of a measurement probe.

Figure 2C:
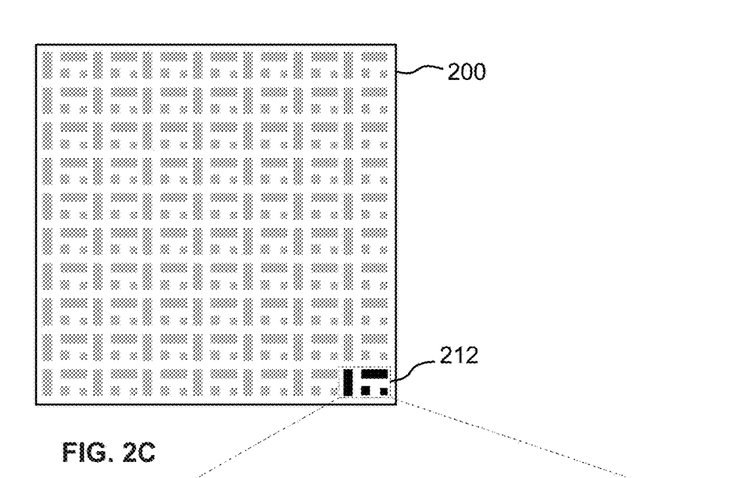
FIG. 2C is a diagram of a thin-film tile on which multiple singulated dies of different sizes and/or functionality have been flip-chip assembled.
Figure 2D:
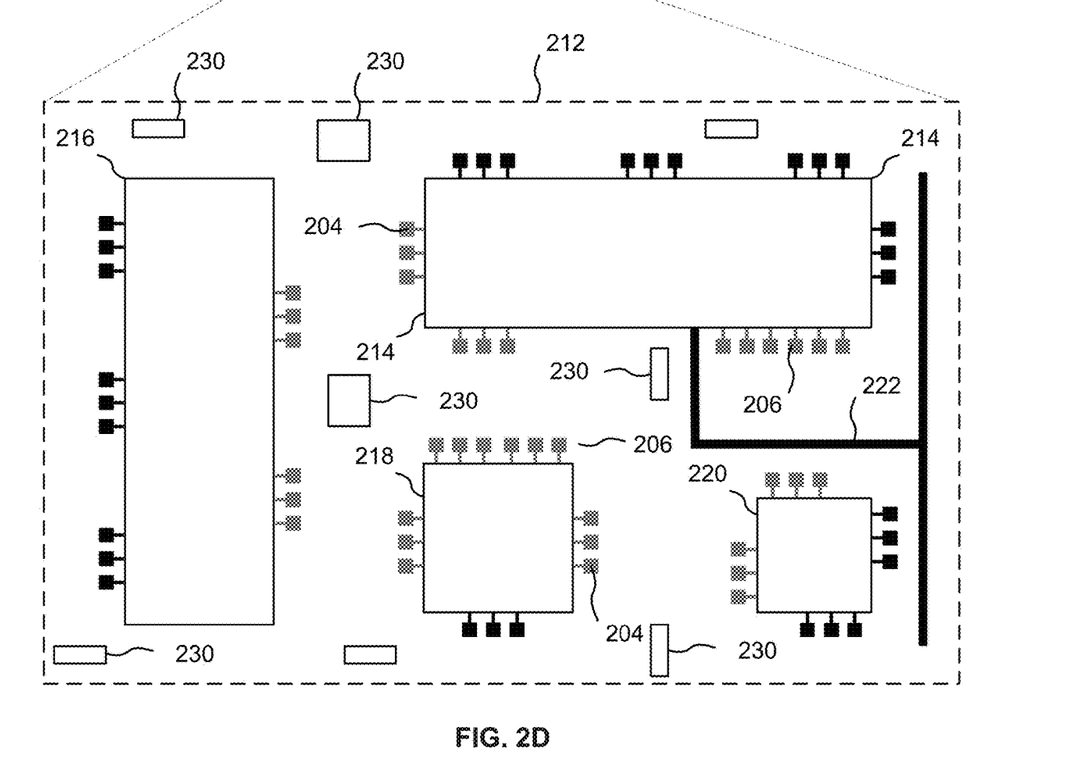
FIG. 2D is an enlarged diagram of a section of FIG. 2C, showing a set of several singulated dies that have been flip-chip assembled on the thin-film tile and which form a functional system or subsystem.

As another example, FIG. 2C is a diagram of a thin-film tile 200 on which multiple singulated dies of different sizes and/or functionality have been flip-chip assembled. Sets of one or more dies form a function die group. For instance, in the example illustrated in FIG. 4C, a die set 212 of four dies form a functional group, and 70 sets of such dies are shown. FIG. 2D is an enlarged diagram of a section of FIG. 2C, showing a set of four singulated dies that have been flip-chip assembled on the thin-film tile 200 and which form a functional system or subsystem interconnected by surface and/or buried conductive traces on or in the thin-file-tile 200. For example, for the die set 212 shown in FIG. 2D, a first die 214 may be an RF "front end" (RFFE) chip comprising amplifiers and switches; a second die 216 may be an RF transceiver chip with up/down converters and IF amplifiers; a third die 218 may be a power control chip; and a fourth die 220 may be a digital/analog chip performing control and baseband functions.

The individual member dies 214-220 of the die sets 212 shown in FIGS. 2C and 2D may be fabricated on separate substrate wafers, singulated, and flip-chip assembled on the thin-film tile 200. Alternatively, the individual dies of the die sets 212 may be fabricated on a single wafer of a single process technology (e.g., an RF CMOS/SOI process) that is capable of supporting all the key functions needed for the desired system or subsystem (although in the case of a common wafer, the dies need not be grouped together on the wafer in the same pattern in which they are flip-chip assembled on the thin-film tile 200). After singulation from the common wafer, the individual dies of the die sets 212 would be flip-chip assembled on the thin-film tile 200.

Similar to the embodiment of FIG. 2B, probe-compatible connection pads 204, 206 may be formed on the thin-film tile 200 arrayed around the periphery of each die 214-220 (not all pads are labelled, to avoid clutter) for use in testing the individual dies 214-220 and/or the dies as a functional whole. Alternatively, probe-compatible connection pads 204, 206 may be formed only around the periphery of the die set 212 as a whole. For example, the interior grayed-colored probe-compatible connection pads 204, 206 shown in FIG. 2D may be omitted. Since the dies 214-220 in a die set 212 are interconnected by surface and/or buried conductive traces on or in the thin-file-tile 200, and the dies 214-220 function as a system or subsystem, it may be sufficient to test the die set 212 as a functional unit rather than testing each individual member die. Even if both periphery and interior probe-compatible connection pads 204, 206 are included, system or subsystem testing may be accomplished by testing only through a subset of such pads; the remaining pads may be used for more thorough testing of some or all of the individual dies 214-220, or may be used for intermittent testing. For example, it may be useful to fully test all dies on a sampling of dies sets (e.g., one of every ten die sets), but perform functional system or subsystem testing on most of the die sets (which would be faster).

In the example shown in FIG. 2D, the ground-signal-ground (GSG) pads 204 are on a standard 150 μm pitch for compatibility with conventional wafer-scale probes and testing equipment. More or fewer sets of GSG pads 204 and/or DC/control signal pads 206 may be used depending on the nature of the circuitry on the die 202, and the spacing and function of the pads 204, 206 may be varied by application.

Before or after flip-chip assembling individual dies 202 or dies sets 214-220 on the thin-film tile 200, one or more passive devices 230 may be embedded in, formed on, and/or affixed to the thin-film tile 200, as shown in FIG. 2D (not all passive devices 230 are labelled, to avoid clutter). While shown in FIG. 2D as generic rectangles, the passive devices 230 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by surface and/or buried conductive traces on or in the thin-file-tile 200 to other passive devices 230 and/or the individual dies 202 or dies sets 214-220.

Figure 3A:
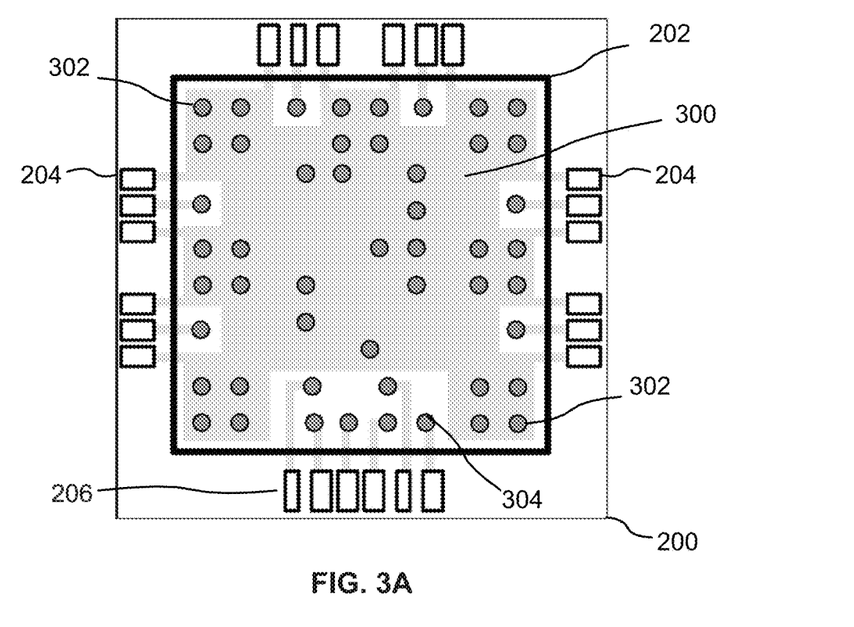
FIG. 3A is a top view, in partial transparency, of one die on a corresponding section of thin-film tile.

FIG. 3A is a top view, in partial transparency, of one die 202 on a corresponding section of thin-film tile 200 (again, the tile 200 has not yet been singulated at this point). In this particular view, the interior contiguous gray area is a ground plane 300 formed on the top surface of the tile 200. One or more electrically conductive structures 302, such as solder bumps, copper pillars, or the like, are configured to connect appropriate circuit elements on the top (i.e., the circuit surface) of the flipped die 202 to the ground plane 300 of the tile 200. In turn, the ground plane 300 is generally connected by through-hole vias to a ground plane (not shown) on the bottom surface of the tile 200 which serves as an interfacing ground with a testing system and/or printed circuit board. Typically, the grounds of the GSG probe-compatible connection pads 204 are connected to the backside ground.

In addition, circuit signals are connected from pad-connection electrically conductive structures 304 (e.g., solder bumps or copper pillars) near the periphery of the die 202 to co-located probe-compatible connection pads 204, 206 on the top side of the tile 200, preferably through impedance-controlled connections (e.g., stripline, microstrip, or coplanar waveguides).

Figure 3B:
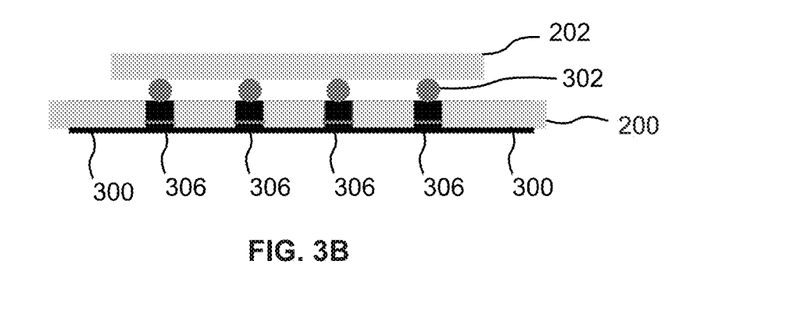
FIG. 3B is a cross-sectional side view of one die on a corresponding section of the thin-film tile.

In alternative embodiments, the ground plane 300 can be formed only on the back surface of the tile 200, and connected by through-hole vias to one or more electrically conductive structures 302 and thus to appropriate circuit elements of the die 202. FIG. 3B is a cross-sectional side view of one die 202 on a corresponding section of the thin-film tile 200 (again, the tile 200 has not yet been singulated at this point). In the illustrated embodiment, four electrically conductive structures 302 in the form of solder bumps are shown coupling the circuit surface of a die 202 through corresponding through-hole vias 306 to a ground plane 300 on the back side of the tile 200. Not shown are other electrically conductive structures 302 connecting the circuit surface of the die 202 to the top side of the tile 200, such as to probe-compatible connection pads 204, 206. One benefit of a back side ground plane 300 is that more of the top side of a tile 200 is available to couple probe-compatible connection pads 204, 206 to interior circuit elements of a die 202.

In yet other embodiments, one portion of the ground plane 300 may be on the top side of a tile 200, and another portion of the ground plane 300 may be on the bottom side of the tile 200, electrically coupled by one or more through-hole vias 306. In still other embodiments, all or part of a ground plane 300 may be a buried layer within a multi-layer thin-film tile 200, connected to a die 202 by some combination of blind vias, buried vias, electrically conductive structures such as solder bumps or copper pillars, and conductive leads. In some embodiments, additional elements may be placed on the thin-film tile 200; for example, calibration structures for wafer probing equipment can be configured on the top and/or bottom of a tile 200.

The front or back surface of the tile 200 also may be used as a location for the formation of other structures. For example, one or more so-called patch antennae may be formed on or affixed to the front or back surface of the tile 200; one example of a front-surface patch antenna 222 is shown in FIG. 2D, coupled to an RFFE die 214. A patch antenna, and various known variations, is a type of radio antenna with a low profile which can be formed or mounted on a flat surface. Thus, by including one or more patch antennae on the tile 200, a complete radio may be created by forming a flip-chip die/tile assembly (as further described below), testing the assembly (either as individual dies or as a die set unit), coating the die/tile assembly with a protective material (e.g., potting compound or a conformal coating), and readying passing units for shipment in a single sequence. If a battery is included as part of such a die/tile assembly, the completed unit could be ready for final shipment as, for example, a wirelessly connected sensor module.

It may be beneficial to test continuity of interconnections in or on the thin-film tile 200 before populating the tile 200 with dies. Any passive devices 230 embedded in or affixed to a tile 200 may also be tested in an initial test of the tile 200 before population with dies.

An additional use of through-hole vias is to couple probe-compatible connection pads 204, 206 on the top side of a tile 200 to connection traces on the bottom side of the tile 200, or to position the probe-compatible connection pads 204, 206 on the bottom side of the tile 200 and couple them to connection traces on the top side of the tile 200, or any combination of such configurations. Probing thus can occur on the bottom side of a tile 200 using the actual signal pads that later will be soldered to the customer's printed circuit board. Such probing may be done with GSG style probes or with Pyramid Probes®, which are a form of a user-defined impedance-controlled probes available from Cascade Microtech, Inc. of Beaverton, Oreg.

Figure 3C:
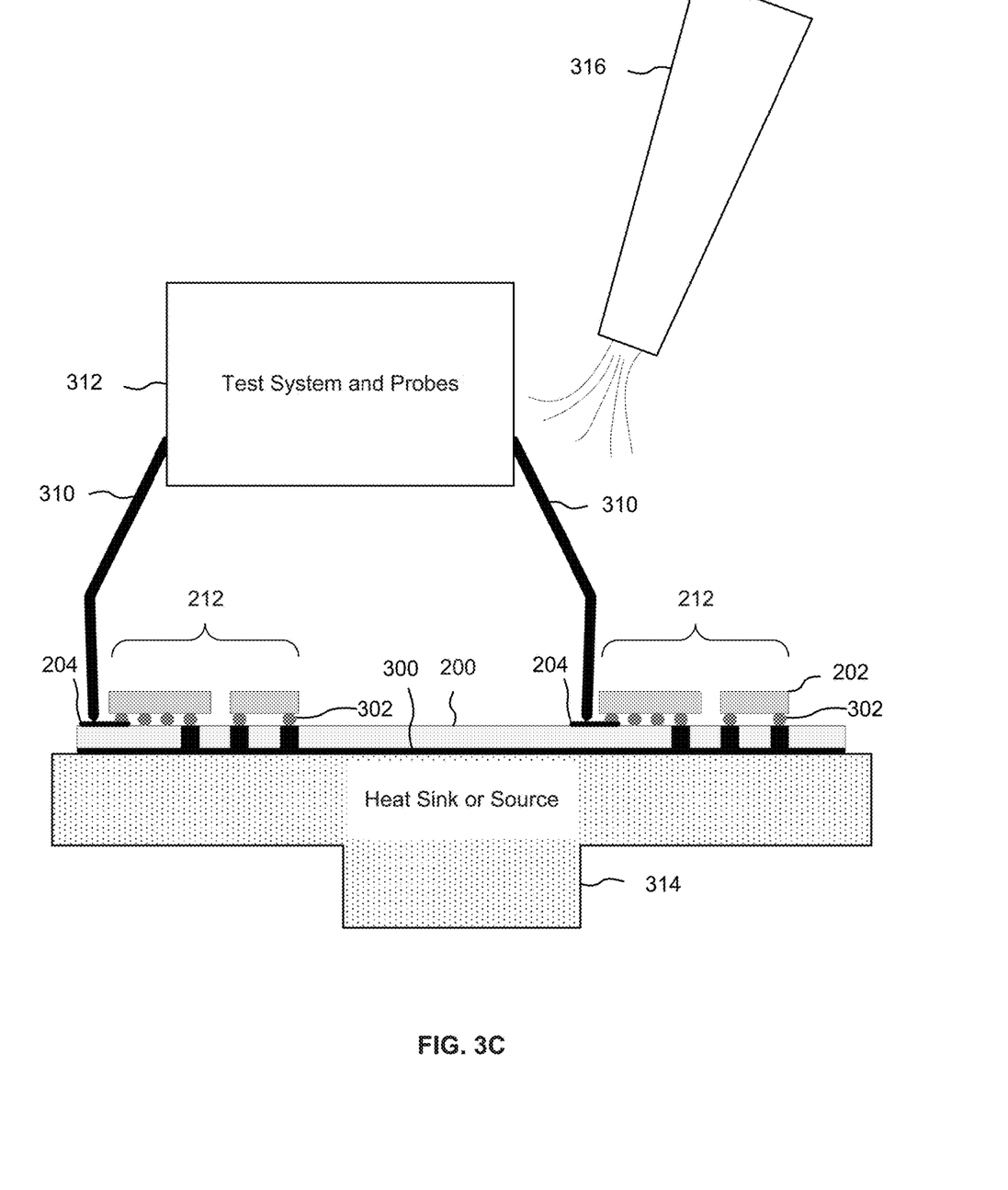
FIG. 3C is a cross-sectional side view of several die sets on a thin-film tile showing a pre-singulation test arrangement for testing an RF system or subsystem.

FIG. 3C is a cross-sectional side view of several die sets 212 on a thin-film tile 200 showing a pre-singulation test arrangement for testing an RF system or subsystem on a flip-chip die/tile assembly. In this example, two probe-compatible connection pads 204 are shown being contacted by a respective probe 310 (e.g., a GSG test probe) coupled to a test system 312. If desired, a heat sink or source 314 may be placed in direct thermal contact with one or more die/tile assemblies under test to add or remove heat during testing in order to get full subsystem measurements for one or more temperature settings (see also the discussion below of FIG. 4). In the illustrated example, the heat sink or source 314 is shown as contacting the bottom of the thin-film tile 200 opposite the die sets 212, allowing a single heat sink or source 314 to span multiple die sets 212 or dies 202. More generally, the die/tile assemblies, before or after singulation, are configured to make thermal contact with a heat sink or source 314 when the probe 310 makes contact with a probe-compatible connection pad 204. Alternatively, a source 316 of temperature controlled gas (e.g., heated and/or cooled air) may be used to add or remove heat during testing.

As should be clear, while FIGS. 3A-3C show embodiments having a single die, the same configurations may be used for die sets 212.

Adequate grounding connections are critical for high frequency RF testing. Such connections have to be kept as short and as numerous as possible to minimize ground inductance. Notably, by using a combination of electrically conductive structures 302 on a flipped die 202 or die set 212, vias (of various kinds), and various top-and-bottom ground plane 300 configurations, any part of the periphery and/or interior of the circuit surface of the die 202 or die set 212 can be coupled to circuit ground. Additionally, the same combination of design elements allows fabrication of impedance-controlled connections from probe-compatible connection pads 204, 206 to test points on the flipped die 202 or die set 212. Further, impedance-controlled connections can be made from top-side probe-compatible connection pads 204, 206 through the thin-film tile 200 to accessible pads on the bottom of the tile 200, in order to allow bottom-side access to the signal ports using surface mount methodologies.

Figure 4:
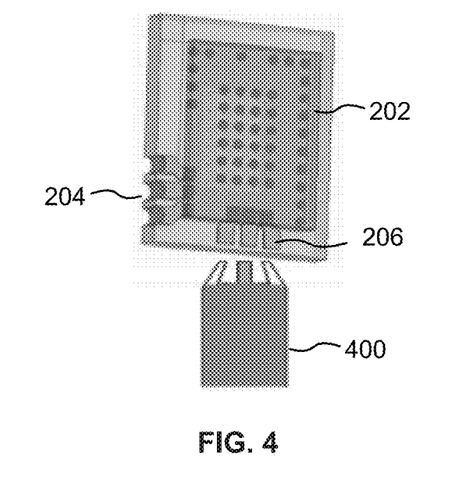
FIG. 4 shows a single die mounted on a portion of a thin film tile and positioned such that a GSG test probe can engage probe-compatible connection pads.

Once dies 202 or die sets 212 are flip-chip mounted to a suitably configured thin-film tile 200, all of the dies 202 or die sets 212 on the entire tile 200 may be probed using automated testing equipment. For example, FIG. 4 is a depiction of a single die 202 (again, pre-singulation) mounted on a portion of a thin-film tile 200 and positioned such that a GSG test probe 400 can engage probe-compatible connection pads 204, 206. Dies 202 or die sets 212 should be placed sufficiently far apart on a tile 200 to provide clearance for the probe tips, which typically will be engage the probe-compatible connection pads 204, 206 at an angle. Note that in the illustrated embodiment, the probe-compatible connection pads 204 are formed within a castellation hole of the tile 200, while the probe-compatible connection pads 206 are formed on the top surface of the tile 200; either configuration is a matter of design choice (a castellation would be formed from a through-hole via at the edge of the tile 200 that is cut in half vertically when the tiles are singulated).

The ability to test probe an entire tile 200 of dies 202 or die sets 212 before singulation and at microwave frequencies (particular from about 8 GHz and above) using automated test equipment is a significant benefit of the invention. Such ability is even more important as frequency increases, particularly from about 12 GHz and above, due to increasing influences of parasitic elements on circuit performance. Just as importantly, the entire process adds little to the automated flow of chip fabrication, testing, and packaging.

Further, when mounted on a thin-film tile 200, each die 202 or die set 212 is in essentially its final electrical configuration, with proper grounding and all parasitic influencing electrical connections established (further packaging, as described below, generally will not add significant additional parasitic influences). Accordingly, test probing more accurately reflects the actual performance of a part being tested, and no confounding socket or fixture is required.

Once test probing is complete, the dies 202 or die sets 212 and the thin-film tile 200 are singulated into die/tile assemblies, noting that a die set 212 would be singulated from a thin-film tile 200 as a single unit (i.e., the individual member dies 214-220 would not be separated from each other, thus, unlike FIG. 2B, there are no internal singulation lines shown in FIG. 2D). If desired, testing (or further testing) may be done after singulation into die/tile assemblies, for example, to ensure that surrounding dies or die sets and the thin-film tile 200 itself do not confound test results.

Since each die/tile assembly is effectively a unitized "chip" in itself, and presents conventional peripheral and/or bottom side connection pads, there are a number of options available for the final package application of the die/tile assemblies.

Figure 5A:
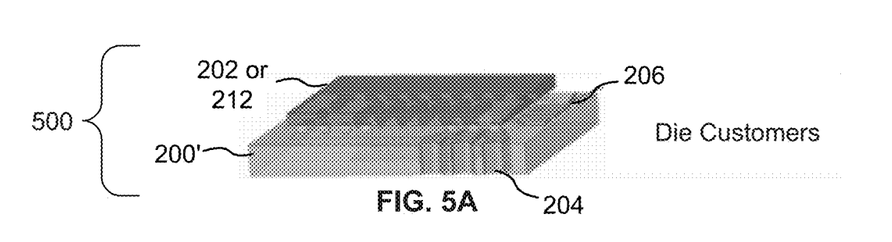
FIG. 5A shows a complete die/tile assembly comprising a flip-chipped die or die set and a singulated segment of the thin-film tile.

FIG. 5A shows a complete die/tile assembly 500 comprising a flip-chipped die 202 or die set 212 and a singulated segment 200' of the thin-film tile 200. Because each flip-chipped die 202 or die set 212 is already mounted on a singulated segment 200' of the tile 200, a customer does not need, for example, to have special equipment for positioning and reflowing a solder bumped die. Accordingly, in some configurations, the singulated die/tile assemblies 500 may be provided directly to a customer configured as conventional (i.e., non flip-chip) "dies" (i.e., quasi-dies) suitable for wire-bonding to a circuit board. For example, for users who are replacing an existing III-V semiconductor (e.g., GaAs) die in a chip-and-wire hybrid assembly, it would be possible to mount a die/thin-film assembly 500 using conductive epoxy and achieve a good microwave ground to the back side of the tile segment 200' of the assembly. The signal ports on the die 202 or die set 212 may then be connected using bond wires from the probe-compatible connection pads 204, 206 to the customer's existing circuit board.

In embodiments in which the probe-compatible connection pads 204, 206 are coupled by impedance controlled line to pads accessible on the bottom of the die/tile assemblies, the die/tile assemblies 500 may be soldered directly to a circuit board using conventional surface mounting technology. Thus, one side of the die/tile assembly is test probed, while the other side (the bottom of the tile) may be used for signal input and output as well as ground connections.

For either of the above usages, the die/tile assemblies 500 may be shipped in a tape-and-reel configuration for use in conventional pick-and-place equipment.

Figure 5B:
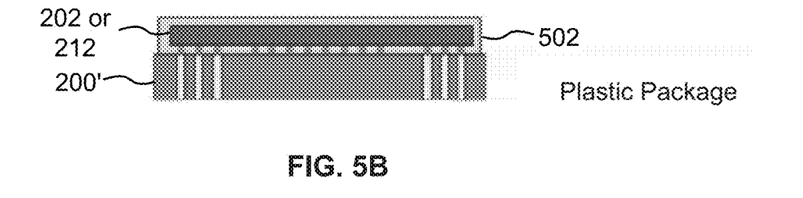
FIG. 5B shows a complete die/tile assembly in an over-molded plastic package, formed in conventional fashion to encapsulate and seal the die or die set.

FIG. 5B shows a complete die/tile assembly embedded within an over-molded plastic package 502, formed in conventional fashion to encapsulate and seal the die 202 or die set 212. In this configuration, the over-molded package 502 may change the performance characteristics of the die 202 or die set 212, but any change should be a systematic offset across all product units.

Figure 5C:
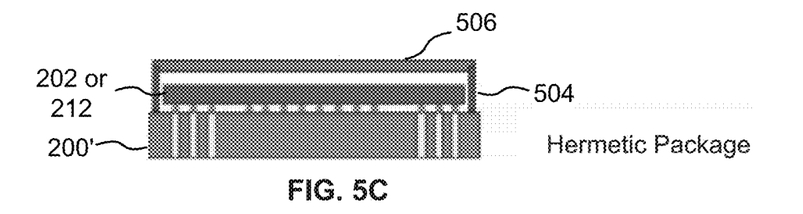
FIG. 5C shows a complete die/tile assembly in a hermitically sealed package.

FIG. 5C shows a complete die/tile assembly encapsulated within a hermetically sealed package. Typically, a ring 504 (generally made of Covar) encircles the die 202 or die set 212 and is sealed to the thin-film tile segment 200', then covered with a lid 506. A hermetically sealed package of the type illustrated should not change the performance characteristics of the die 202 or die set 212.

Benefits

Advantages of die/tile assemblies include ease of testing, reduction of parasitics, lower cost, reduced size, and higher performance. These advantages actually increase for die/tile assemblies that include a die set 212.

For example, since a full subsystem of two or more components is being tested, final subsystem performance may be tested instead of individual die testing, thereby reducing overall test time and cost (although there is still an option for individual die testing as well, particularly for critical chip components). As is known in the art, testing large digital chips is done at a subsystem-level, thus avoiding testing every transistor inside the chip. For instance, techniques such as boundary or periphery scanning may be applied to testing digital chips, allowing overall performance of a subsystem to be measured and guaranteed without testing each transistor and internal node. Such functional testing reduces cost and chip handling while guaranteeing overall performance. The advantage of testing at the subsystem or periphery-level has even greater advantages for RF subsystems than it does for digital chips (it being understood that "periphery" means functional periphery, not literally just physically surrounding the outermost bounds of chips). This is largely due to multiple performance requirements of RF that generally far exceed those of digital circuitry. For example, RF circuitry and systems require parameters to be met—such as linearity, isolation, analog levels, harmonic generation and impedance—that generally do not apply to digital circuitry.

Another major advantage of multi-chip die/tile assemblies is reduced test time and cost. In a conventional approach, each die of a multi-die set is individually tested, then assembled into a module or subsystem, which is then itself tested. Multi-chip die/tile assemblies allow testing of from one to all chips in the assembly in one test session. Embodiments of the invention reduce test time, cost, and handling by as much as half or more. This advantage also reduces total manufacturing time, which is a substantial advantage in today's tight supply chain management systems, and further reduces cost by reducing work-in-process (WIP) and inventory.

Cost may also be reduced due to improved yield. In the case of testing individual dies, test limits must be set to accommodate parasitics as well as guard bands against test variability (guard bands are built-in allowances or tolerances for whatever errors will be accumulated during the entire parameter testing process; guard bands are implemented to make production electrical testing more conservative—that is, slightly over-rejecting—relative to specifications, and decrease the probability that a customer will get products that do not meet specifications). Testing different die at different times or in different test systems can force increased guard bands, thereby decreasing yield. With multi-chip die/tile assemblies, all dies in the system may be tested together and on the same test system, with a final configuration of inter-die connections. Since system-level performance is the end goal of all testing, wider test limits and periphery-level system testing of multi-chip die/tile assemblies can yield substantial manufacturing benefits.

Additional benefit of the ability to test multi-chip die/tile assemblies as a unit (rather than as individual chips) includes the capability to have high impedance signal paths between chips within a die set 212. For example, to reduce power consumption, chip-to-chip impedance may be designed to be at about 75-200 ohms (or, more generally, greater than the characteristic input impedance of the test probes). It would be difficult to test high impedance configurations at the chip level since virtually all RF test equipment is designed to have an approximately 50-ohm input impedance.

Embodiments of the current invention allow individual chip testing if required for a particular chip or function. An example would be to ensure the efficiency of a power amplifier chip or the noise figure of a low noise amplifier chip. While such measurements may be inferred from a system-level test, such measurements alternatively could be tested directly by applying test probes to probe-compatible connection pads 204, 206 coupled to a particular chip. For some systems in which cost is more critical than a small parameter miss (e.g., a Bluetooth multi-chip die/tile assembly), such measurements could be inferred. However, if the system is high value and requires detailed performance knowledge (e.g., a multi-chip die/tile assembly for a base station power amplifier), a critical stage chip could be tested individually in addition to testing the multi-chip die/tile assembly at a system level.

It is generally important, for cost and overall yield reasons, that individual chips have a minimum yield due to the effect of stacked yield, in which a single low-yield die can cause the loss of other good die in a system assembly. This is a well-known issue for complex systems and can be handled by well-known techniques, such as pre-testing any low-yielding components. Also, use of adjustable or programmable dies can mitigate effects of die yield or variation, with die modifications potentially under test control, thereby further increasing yield. It is also possible to add redundant circuit elements, much in the way memory chips have extra rows and columns added, to reduce sensitivity to failure of a single transistor or element of a die.

As mentioned above, embodiments of the present invention, particularly multi-chip die/tile assemblies, can be used to implement fully functional systems. For example, in the "Internet of Things" (IoT) market, which requires very low cost and very high volumes, embodiments of the present invention enable substantial improvements in flexibility, cost, size, and performance in the manufacture and validation of final RF electronic systems and subsystems. Driving down cost while improving reliability and consistency may be most important in driving the volume of the system and thereby driving its overall benefits. Embodiments of the present invention effectively enable fabrication of an entire radio system in a single die/tile assembly, and thus enable substantial reductions in cost and increases of volume for such applications as IoT, Bluetooth, WiFi, radar, 5G cellular, future cellular standards, and other transmitted RF systems.

While the embodiments described above have focused on packaging structures for microwave integrated circuits, the structures and techniques of this disclosure also may be applied to other ICs, particularly where system or subsystem testing is useful. Such ICs include digital ICs and high power ICs (e.g., where high socket resistance in a conventional test system can distort measurements).

Methods

Figure 6:
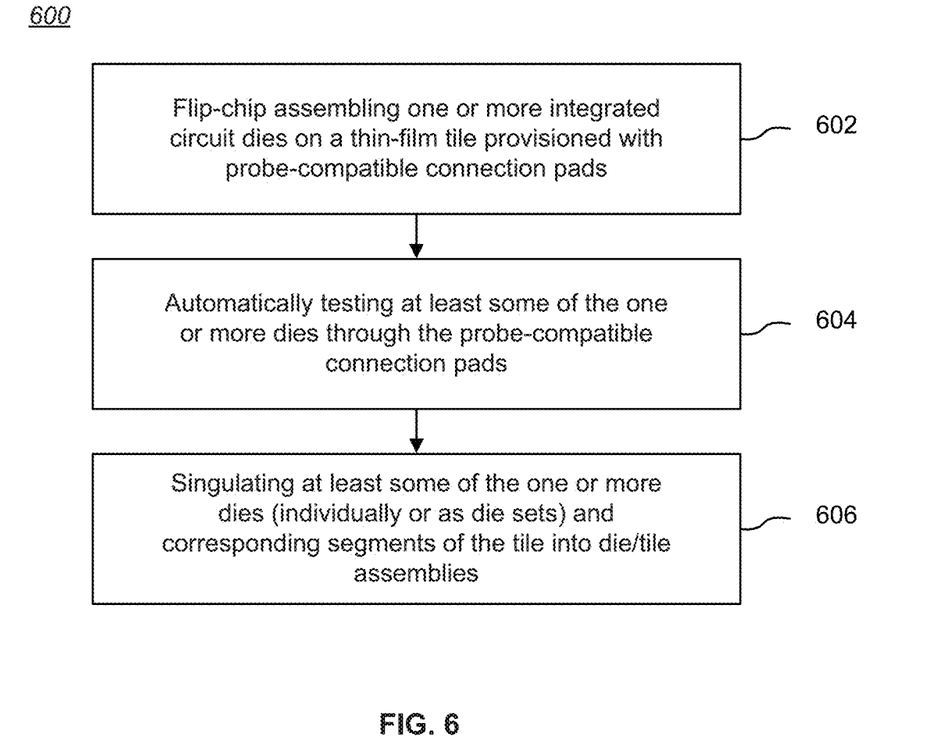
FIG. 6 is a process flow diagram of a first method for fabricating and testing a flip-chip assembled integrated circuit packaging structure.

Another aspect of the invention includes methods for fabricating and testing flip-chip assembled integrated circuit packaging structures. For example, FIG. 6 is a process flow diagram 600 of a first method for fabricating and testing a flip-chip assembled integrated circuit packaging structure, including:

flip-chip assembling one or more integrated circuit dies on a thin-film tile provisioned with probe-compatible connection pads (Block 602);

automatically testing at least some of the one or more dies through the probe-compatible connection pads (Block 604); and singulating at least some of the one or more dies (individually or as die sets) and corresponding segments of the tile into die/tile assemblies (Block 606).

Figure 7:
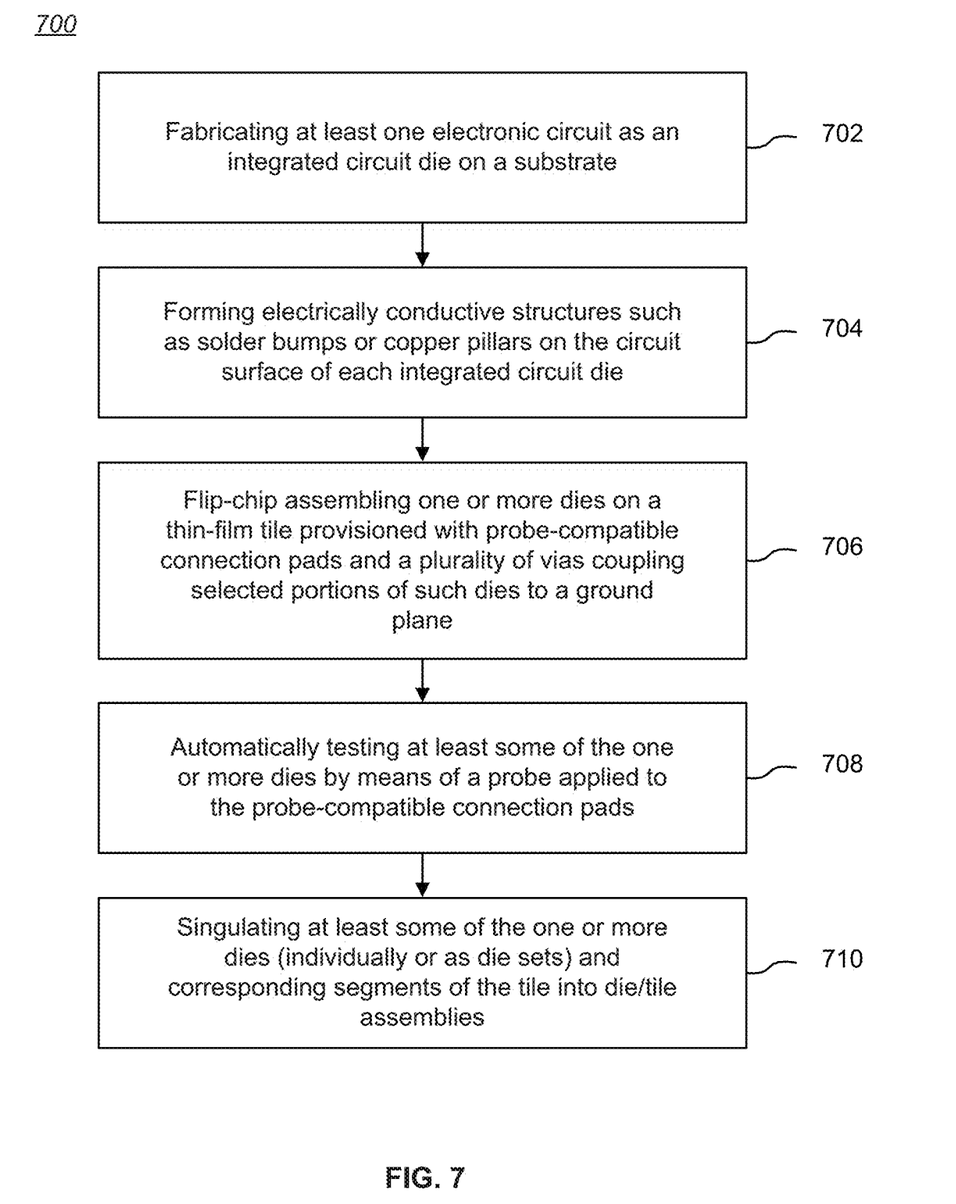
FIG. 7 is a process flow diagram of a second method for fabricating and testing a flip-chip assembled integrated circuit packaging structure.

As another example, FIG. 7 is a process flow diagram 700 of a second method for fabricating and testing a flip-chip assembled integrated circuit packaging structure, including:

fabricating at least one electronic circuit as an integrated circuit die on a substrate (Block 702);

forming electrically conductive structures such as solder bumps or copper pillars on the circuit surface of each integrated circuit die (Block 704);

flip-chip assembling one or more dies on a thin-film tile provisioned with probe-compatible connection pads and a plurality of vias coupling selected portions of such dies to a ground plane (Block 706);

automatically testing at least some of the one or more dies by means of a probe applied to the probe-compatible connection pads (Block 708); and singulating at least some of the one or more the dies (individually or as die sets) and corresponding segments of the tile into die/tile assemblies (Block 710).

The above methods further include various combinations of additional or modifying steps:

wherein one or more passive devices is embedded in, formed on, and/or affixed to the thin-film tile;

wherein the thin-film tile has a front and a back surface, and further including at last one patch antenna formed on or affixed to at least one of the front surface and/or the back surface of the thin-film tile;

wherein the die/tile assembly further includes a battery;

using only a subset of probe-compatible connection pads for testing;

wherein the die/tile assembly is configured to be thermally coupled to a heat source or sink when at least one probe makes contact with one of the probe-compatible connection pads;

wherein two or more flip-chipped integrated circuit dies are interconnected by a signal path having an impedance greater than the characteristic input impedance of the one or more probes;

wherein two or more integrated circuit dies are interconnected by a signal path having an impedance greater than about 50 ohms;

configuring at least some of the probe-compatible connection pads as ground-signal-ground sets of pads;

utilizing a thin-film tile having a thickness of less than or equal to about 0.35 mm, or about 0.23 mm, or about 0.175 mm;

wherein the thin-film tile is made of one of alumina or a low temperature co-fired ceramic;

wherein at least one integrated circuit die is fabricated on one of a silicon or silicon-on-insulator substrate;

wherein the die/tile assemblies are configured for wire-bonding to a circuit board;

wherein the die/tile assemblies are configured to be soldered directly to a circuit board, including by using surface mounting methodologies;

wherein the die/tile assemblies are configured to be embedded within an over-molded plastic package;

wherein the die/tile assemblies are configured to be encapsulated within a hermitically sealed package;

wherein at least some of the one or more integrated circuit dies are tested at frequencies at or above about 8 GHz;

wherein at least some of the one or more integrated circuit dies are tested at frequencies at or above about 12 GHz;

disposing the probe-compatible connection pads on the side of the thin-film tile on which the one or more integrated circuit dies are mounted;

disposing the probe-compatible connection pads on the side of the thin-film tile opposite from the side on which the one or more integrated circuit dies are mounted;

disposing the probe-compatible connection pads on the side of the tile on which the one or more integrated circuit dies are mounted, and making signal connections to the one or more integrated circuit dies from the side of the tile opposite from the side of the tile on which the one or more integrated circuit dies are mounted;

forming a ground plane on the side of the tile on which the one or more integrated circuit dies are flip-chip assembled, and electrically coupling the ground plane to selected circuit elements of the one or more integrated circuit dies by means of electrically conductive structures such as solder bumps or copper pillars;

forming a ground plane on the side of the tile opposite from the side on which the one or more integrated circuit dies are flip-chip assembled, and electrically coupling the ground plane to selected circuit elements of the one or more integrated circuit dies by means of through-hole vias within the tile and electrically conductive structures (e.g., solder bumps or copper pillars) in electrical contact with the through-hole vias;

forming a first ground plane on the side of the tile on which the one or more integrated circuit dies are flip-chip assembled and electrically coupling the first ground plane to selected circuit elements of the one or more integrated circuit dies by means of electrically conductive structures such as solder bumps or copper pillars, and forming a second ground plane formed on the side of the tile opposite from the side on which the one or more integrated circuit dies are flip-chip assembled and electrically coupling the second ground plane to the first ground plane by through-hole vias within the tile;

wherein at least one of the one or more integrated circuit dies includes a microwave integrated circuit; and/or wherein the electrically conductive structures are one of solder bumps or copper pillars.

While the above embodiments are particularly useful when using silicon-based substrates (e.g., Si, SOT, SOS, etc.), the inventive concepts are applicable to other semiconductor substrates, including (but not limited to) silicon carbide and the III-V group of semiconductors (e.g., GaAs, GaN), as well as to organic substrates.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An integrated circuit packaging structure, including:
   (a) a thin-film tile having a first surface and a second surface, the thin-film tile provisioned with a plurality of probe-compatible connection pads on at least one of the first surface and/or the second surface; and
   (b) a plurality of integrated circuit dies flip-chip assembled on at least the first surface of the thin-film tile, each integrated circuit die and a corresponding portion of the thin-film tile forming a die/tile assembly testable at microwave radio frequencies;
       wherein the plurality of probe-compatible connection pads on at least one of the first surface and/or the second surface of the thin-film tile are accessible for connection to one or more probes after assembly of the plurality of flip-chipped integrated circuit dies on the thin-film tile, and the thin-film tile is configured to allow testing, including testing at microwave radio frequencies, of some or all of the plurality of integrated circuit dies flip-chip assembled on at least the first surface of the thin-film tile before singulation of the die/tile assemblies.

2. The invention of claim 1, wherein two or more of the plurality of integrated circuit dies are interconnected by a signal path having an impedance greater than about 50 ohms.

3. The invention of claim 1, wherein at least some of the plurality of probe-compatible connection pads are configured as ground-signal-ground sets of pads.

4. The invention of claim 1, wherein the thin-film tile has a thickness of less than or equal to about 0.35 mm.

5. The invention of claim 1, wherein the thin-film tile is made of one of alumina or a low temperature co-fired ceramic.

6. The invention of claim 1, where at least one of the plurality of integrated circuit dies is fabricated on one of a silicon or silicon-on-insulator substrate.

7. The invention of claim 1, wherein at least one die/tile assembly is configured for wire-bonding to a circuit board.

8. The invention of claim 1, wherein at least one die/tile assembly is configured to be soldered directly to a circuit board.

9. The invention of claim 1, wherein at least one die/tile assembly is configured to be soldered directly to a circuit board using surface mounting methodologies.

10. The invention of claim 1, wherein at least one die/tile assembly is configured to be embedded within an overmolded plastic package.

11. The invention of claim 1, wherein at least one die/tile assembly is configured to be encapsulated within a hermitically sealed package.

12. The invention of claim 1, wherein at least one die/tile assembly is testable at frequencies at or above about 8 GHz.

13. The invention of claim 1, wherein the plurality of probe-compatible connection pads are disposed on the side of the thin-film tile on which the plurality of integrated circuit dies are flip-chip assembled.

14. The invention of claim 1, wherein the plurality of probe-compatible connection pads are disposed on the side of the thin-film tile opposite from the side on which the plurality of integrated circuit dies are flip-chip assembled.

15. The invention of claim 1, wherein the plurality of probe-compatible connection pads are disposed on the side of the tile on which the plurality of integrated circuit dies are flip-chip assembled, and wherein signal connections to the plurality of integrated circuit dies are made from the side of the tile opposite from the side of the tile on which the plurality of integrated circuit dies are flip-chip assembled.

16. The invention of claim 1, further including a ground plane formed on the side of the tile on which the plurality of integrated circuit dies are flip-chip assembled, and electrically coupled to selected circuit elements of the plurality of integrated circuit dies by means of electrically conductive structures.

17. The invention of claim 1, further including a ground plane formed on the side of the tile opposite from the side on which the plurality of integrated circuit dies are flip-chip assembled, and electrically coupled to selected circuit elements of the plurality of integrated circuit dies by means of through-hole vias within the tile and electrically conductive structures in electrical contact with the through-hole vias.

18. The invention of claim 1, further including:
(a) a first ground plane formed on the side of the tile on which the plurality of integrated circuit dies are flip-chip assembled and electrically coupled to selected circuit elements of the plurality of integrated circuit dies by means of electrically conductive structures; and
(b) a second ground plane formed on the side of the tile opposite from the side on which the plurality of integrated circuit dies are flip-chip assembled and electrically coupled to the first ground plane by through-hole vias within the tile.

19. The invention of claim 1, wherein at least one of the plurality of integrated circuit dies includes a microwave integrated circuit.

20. The invention of claim 1, wherein the plurality of integrated circuit dies are assembled on the thin-film tile by one of solder bumps or copper pillars.

21. An integrated circuit packaging structure including:
(a) a thin-film tile having a first surface and a second surface, and provisioned with a plurality of probe-compatible connection pads on at least one of the first surface and/or the second surface and a plurality of vias within the tile;
(b) at least one electronic circuit embodied in a plurality of integrated circuit dies on a silicon-based substrate; and
(c) electrically conductive structures positioned on each of the plurality of integrated circuit dies configured to affix the plurality of integrated circuit dies on at least the first surface of the thin-film tile, each integrated circuit die and a corresponding portion of the thin-film tile forming a die/tile assembly testable at microwave radio frequencies;
wherein the plurality of probe-compatible connection pads on at least one of the first surface and/or the second surface of the thin-film tile are accessible for connection to probes after assembly of the plurality of integrated circuit dies on the thin-film tile, and the thin-film tile is configured to allow testing, including testing at microwave radio frequencies, of some or all of the plurality of integrated circuit dies affixed on at least the first surface of the thin-film tile before singulation of the die/tile assemblies.

22. The invention of claim 21, wherein two or more of the plurality of integrated circuit dies are interconnected by a signal path having an impedance greater than about 50 ohms.

23. The invention of claim 21, wherein at least some of the plurality of probe-compatible connection pads are configured as ground-signal-ground sets of pads.

24. The invention of claim 21, wherein the thin-film tile has a thickness of less than or equal to about 0.35 mm.

25. The invention of claim 21, wherein the thin-film tile is made of one of alumina or a low temperature co-fired ceramic.

26. The invention of claim 21, wherein the silicon-based substrate is one of a silicon or silicon-on-insulator substrate.

27. The invention of claim 21, wherein at least one die/tile assembly is configured for wire-bonding to a circuit board.

28. The invention of claim 21, wherein at least one die/tile assembly is configured to be soldered directly to a circuit board.

29. The invention of claim 21, wherein at least one die/tile assembly is configured to be soldered directly to a circuit board using surface mounting methodologies.

30. The invention of claim 21, wherein at least one die/tile assembly is configured to be embedded within an overmolded plastic package.

31. The invention of claim 21, wherein at least one die/tile assembly is configured to be encapsulated within a hermitically sealed package.

32. The invention of claim 21, wherein at least one die/tile assembly is testable at frequencies at or above about 8 GHz.

33. The invention of claim 21, wherein the plurality of probe-compatible connection pads are disposed on the side of the thin-film tile on which the plurality of integrated circuit dies are coupled.

34. The invention of claim 21, wherein the plurality of probe-compatible connection pads are disposed on the side of the thin-film tile opposite from the side on which the plurality of integrated circuit dies are coupled.

35. The invention of claim 21, wherein the plurality of probe-compatible connection pads are disposed on the side of the tile on which the plurality of integrated circuit dies are coupled, and wherein signal connections to the plurality of integrated circuit dies are made from the side of the tile opposite from the side of the tile on which the plurality of integrated circuit dies are coupled.

36. The invention of claim 21, further including a ground plane formed on the side of the tile on which the plurality of integrated circuit dies are coupled, and electrically coupled to selected circuit elements of the plurality of integrated circuit dies by means of electrically conductive structures.

37. The invention of claim 21, further including a ground plane formed on the side of the tile opposite from the side on which the plurality of integrated circuit dies are coupled, and electrically coupled to selected circuit elements of the integrated circuit die by means of through-hole vias within the tile and electrically conductive structures in electrical contact with the through-hole vias.

38. The invention of claim 21, further including:
(a) a first ground plane formed on the side of the tile on which the plurality of integrated circuit dies are coupled, the first ground plane electrically coupled to selected circuit elements of the plurality of integrated circuit dies by means of electrically conductive structures; and
(b) a second ground plane formed on the side of the tile opposite from the side on which the plurality of integrated circuit dies are coupled, the second ground plane electrically coupled to the first ground plane by through-hole vias within the tile.

39. The invention of claim 21, wherein at least one of the plurality of integrated circuit dies includes a microwave integrated circuit.

40. The invention of claim 21, wherein the electrically conductive structures are one of solder bumps or copper pillars.

* * * * *